United States Patent [19]

Watanabe

[11] Patent Number: 5,057,926

[45] Date of Patent: Oct. 15, 1991

[54] DRIVING METHOD FOR DISCHARGING OVERFLOW CHARGES IN A SOLID STATE IMAGING DEVICE

[75] Inventor: Tohru Watanabe, Ohgaki, Japan

[73] Assignee: Sanyo Electric Co., Ltd., Moriguchi, Japan

[21] Appl. No.: 534,236

[22] Filed: Jun. 7, 1990

[30] Foreign Application Priority Data

Jun. 20, 1989 [JP] Japan .................................. 1-157369
Jul. 17, 1989 [JP] Japan .................................. 1-183976

[51] Int. Cl.$^5$ ........................................... H04N 5/232
[52] U.S. Cl. ........................... 358/213.11; 358/213.19; 358/213.26
[58] Field of Search ...................... 358/213.11, 213.13, 358/213.15, 213.19, 213.26, 213.27, 213.31, 209; 357/24, 24 LR, 24 M

[56] References Cited

U.S. PATENT DOCUMENTS

| | | | |
|---|---|---|---|
| 4,875,100 | 10/1989 | Yonemoto et al. | 358/213.19 |
| 4,875,101 | 10/1989 | Endo et al. | 358/213.19 |
| 4,885,626 | 12/1989 | Coutures | 357/24 LR |
| 4,912,560 | 3/1999 | Osawa et al. | 358/213.19 |

*Primary Examiner*—James J. Groody
*Assistant Examiner*—Tuan V. Ho
*Attorney, Agent, or Firm*—Fish & Richardson

[57] ABSTRACT

A method of driving a solid-state imaging device for discharging optical charge stored in a channel area of a solid-state imaging device so as to adjust exposure. In a solid-state imaging device having a horizontal-type overflow drain structure in which an overflow drain is formed at a channel stop for dividing a channel area, optical charge stored in the channel area is transferred in an opposite direction to a reading direction during a vertical scanning period and a potential barrier between the channel area and the overflow drain is extinguished during the period of transfer of optical charge, thereby discharging the charge. The optical charge stored again in the channel area is transferred in the reading direction within a blanking period during the vertical scanning period. In driving a device having a vertical-type overflow drain structure in which a channel area is formed by being divided in a diffusion area formed on a semiconductor substrate, optical charge stored in the channel area is transferred in an opposite direction to a reading direction during a vertical scanning period and a potential barrier between the channel area and the semiconductor substrate is extinguished during the period of transfer of the optical charge, thereby discharging the optical charge. The optical charge stored again in the channel area is transferred in the reading direction within a blanking period during the vertical scanning period. Exposure of the solid-state imaging device is adjusted by means of a discharge timing.

14 Claims, 8 Drawing Sheets

DRIVING METHOD FOR DISCHARGING OVERFLOW CHARGES IN A SOLID STATE IMAGING DEVICE

BACKGROUND OF THE INVENTION

1. Field of the Invention

The present invention relates to a method of driving a solid-state imaging device for discharging optical charge stored in channel areas to outside the channel areas.

2. Description of the Related Art

Conventionally, in an image pickup apparatus such as a television camera using a CCD solid-state imaging device, it has been conceived to effect exposure control electronically by making use of an operating principle of a CCD. As disclosed in Japanese Patent Laid-Open No. 24764/1988, such a method of exposure control is effected by transferring and discharging optical charge stored in an imaging portion up until a point in a period of photoelectric conversion for each vertical scanning period and by storing optical charge obtained by effecting photoelectric conversion during the remaining period of photoelectric conversion. That is, the period of photoelectric conversion is extended or shortened in correspondence with a change in the timing of discharge of optical charge, and the timing of discharge of optical charge is set in correspondence with the level of an output signal of the CCD.

With such a method of driving a CCD solid-state imaging device, unnecessary optical charge in the imaging portion is discharged by being transferred in an opposite direction to a direction in which reading and transfer is effected. However, in the discharge of optical charge by being transferred in the opposite direction, a problem is encountered in that smear occurs during the transfer and discharge in the same way as during reading and transfer. For that reason, various methods of discharging optical devices in which the smear does not occur have been conceived.

For instance, in Japanese Patent Application No. 96712/1989 filed by the present applicant, there is proposed a solid-state imaging device of a horizontal-type overflow drain structure with the drain disposed in parallel with a storage and transfer channel of an imaging portion, wherein a potential barrier between the storage channel and an overflow drain is extinguished before the optical charge is discharged from the storage and transfer channel to the overflow drain.

Figure 3:
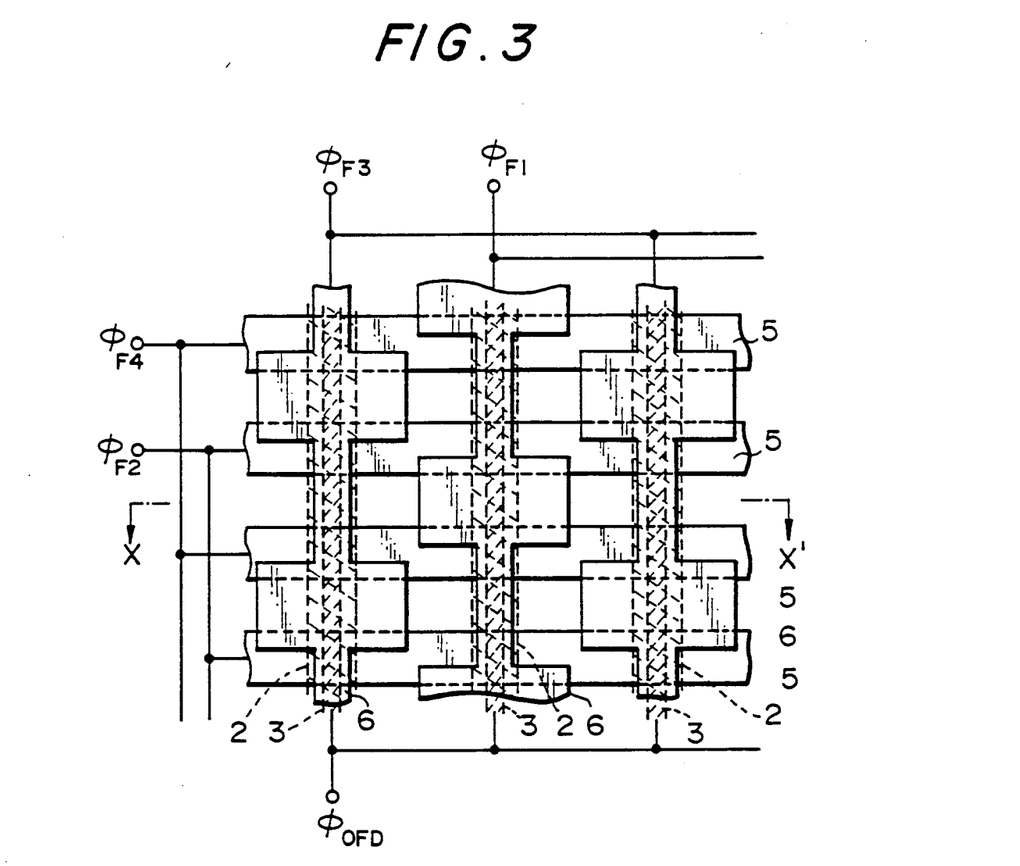
FIG. 3 is a top plan view of an essential portion of a CCD solid-state imaging device.
Figure 4:
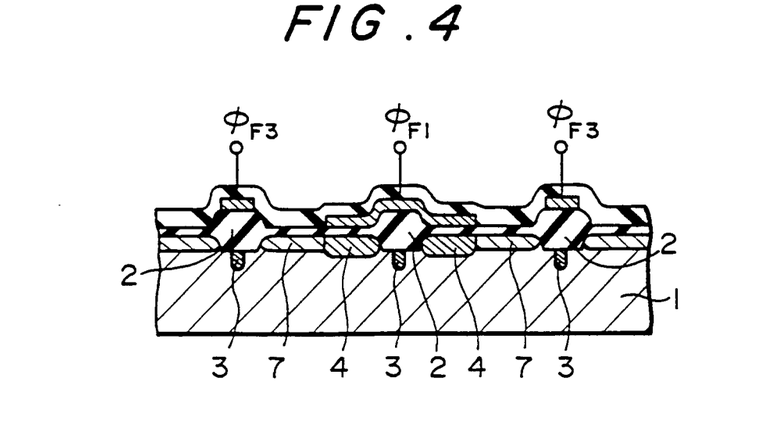
FIG. 4 is a cross-sectional view taken along the line X—X' of FIG. 3.

FIG. 3 is a top plan view of an essential portion of a CCD solid-state imaging device adopting the above-described driving method, and FIG. 4 is a cross-sectional view taken along the line X—X' of FIG. 3. Here, an imaging portion of a frame transfer-type CCD of a cross-gate structure is shown.

A plurality of channel stops 2 are arranged on one surface of a p-type semiconductor substrate 1 in parallel with each other by means of localized oxidation of silicon (LOCOS), an overflow drain 3 being formed below each of the channel stops 2. An n-type channel area 4 is formed between adjacent ones of the channel stops 2 in a diffusion process. A plurality of lower-layer electrodes 5 are provided in parallel on the channel areas 4 in a direction perpendicular to the channel stop 2, and a plurality of upper-layer electrodes 6 are provided along the respective channel stops 2. A projecting portion for covering each gap between adjacent ones of the lower-layer electrodes 5 is formed on each of the upper-layer electrodes 6 in such a manner as to be offset with the adjacent ones of the upper-layer electrodes 6.

Figure 5:
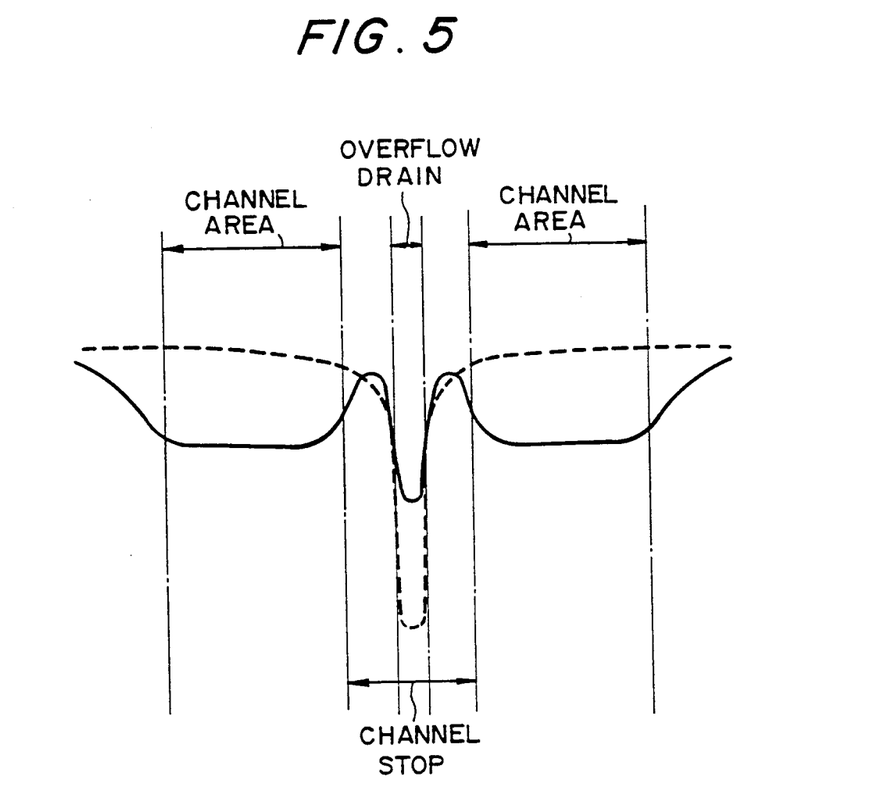
FIG. 5 is a diagram of potential in the CCD solid-state imaging device.

The electrodes 5, 6 are driven by pulses by means of four-phase transfer clocks $\phi_{F1}$–$\phi_{F4}$, and the transfer clocks $\phi_{F1}$, $\phi_{F3}$ and the transfer clocks $\phi_{F2}$, $\phi_{F4}$ are alternately applied to the upper-layer electrodes 6 and the lower-layer electrodes 5, respectively. In addition, a potential control clock $\phi_{OFD}$ is applied to the overflow drain 3. When optical charge is stored in the channel areas 4 by setting the potential of the transfer clock $\phi_{F1}$ to high level and the potential of the control clock $\phi_{OFD}$ to low level, the potential inside the substrate 1 is made shallow between the channel area 4 and the overflow drain 3, as shown in FIG. 5, thereby forming a potential barrier. Accordingly, optical charge occurring in light-receiving areas 7 flow to below the projecting portions of the upper-layer electrodes 6 along the gradient of the potential and are stored in the channel areas 4.

Meanwhile, when the optical charge inside the channel areas 4 is to be discharged, the potential barrier between the channel area 4 and the overflow drain 3 is extinguished by setting the potential of the transfer clock $\phi_{F1}$ to low level and the potential of the control clock $\phi_{OFD}$ to high level contrary to the case of storage, as shown in FIG. 5. When the potential barrier disappears, the optical charge inside the channel areas 4 flows to the overflow drains 3 along the potential gradient. Accordingly, the optical charge inside the channel areas 4 is discharged.

In accordance with such a method of discharging optical charge, it is possible to discharge the overall optical charge in the imaging portion substantially simultaneously and within a very short period of time, so that the smear is suppressed substantially in contrast to the method of discharging optical charge through reverse transfer.

However, when the optical charge is allowed to flow from the channel areas 4 to the overflow drains 3, there are cases where unnecessary optical charge remains in the channel areas 4. This is attributable to the concentration of impurities contained in such as the channel areas 4 and the overflow drains 3 as well as variations during manufacture in the thickness of the LOCOS portions of the channel stops 2 and the like, which creates areas where the potential barrier between the channel area 4 and the overflow drain 3 is liable to disappear and areas where it is difficult to disappear. If the potential at each area is made uniform, optical charge remains in areas where the potential barrier is difficult to disappear. To prevent the optical charge from remaining in this manner, a very high potential difference that will cause the potential barrier between the channel area 4 and the overflow drain 3 to disappear sufficiently needs to be provided between the channel area 4 and the overflow drain 3 for all the areas. Accordingly, there arises the problem that the voltage of the driving pulses for driving the CCD becomes disadvantageously high.

In addition, in Japanese Patent Application No. 96713/1989 filed by the present applicant, there is proposed a solid-state imaging device of a vertical type overflow drain structure with channel areas formed separately in a diffusion area on a semiconductor substrate, by increasing the potential of the semiconductor substrate where overflow drains are formed, the potential barrier between the storage and transfer channel and the semiconductor substrate is extinguished so as to discharge optical charge from the storage and transfer channel to the semiconductor substrate side.

Figure 8:
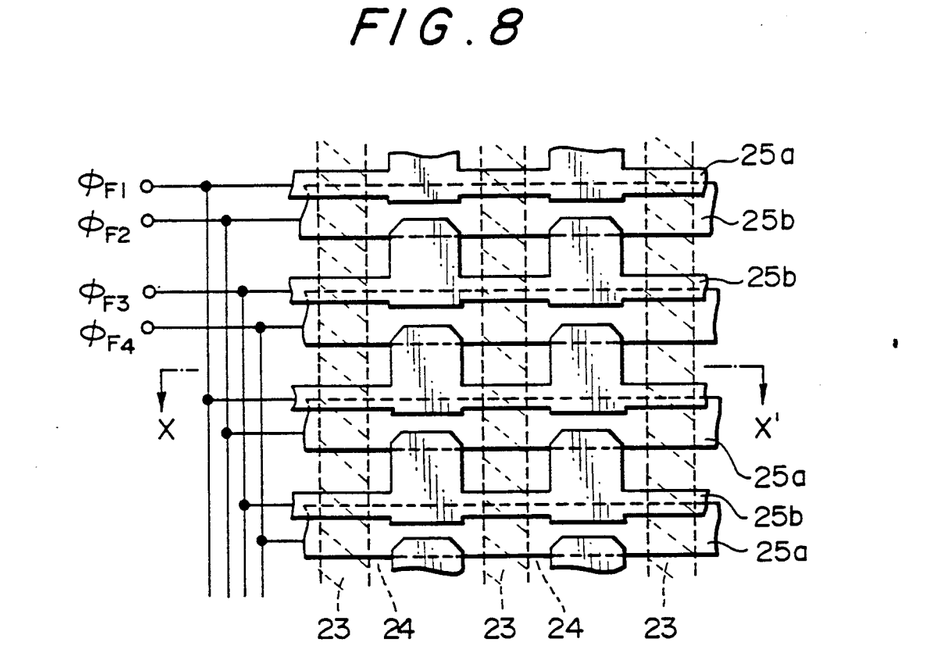
FIG. 8 is a top plan view of an essential portion of a CCD solid-state imaging device.
Figure 9:
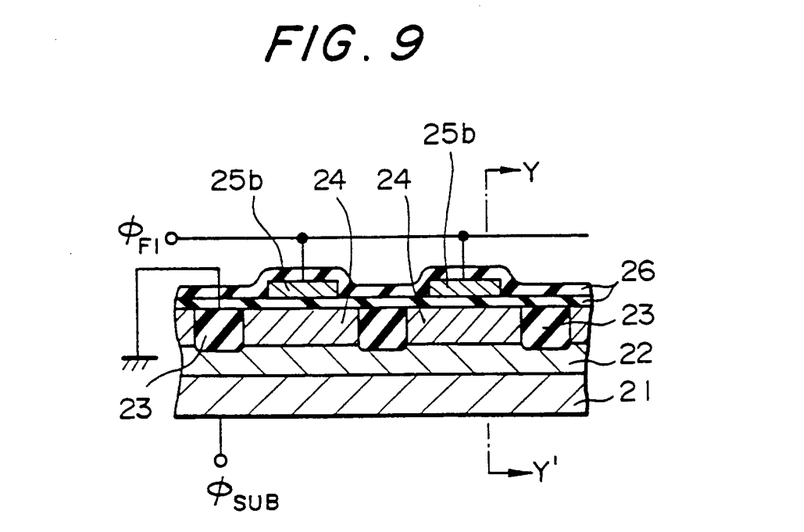
FIG. 9 is a cross-sectional view taken along the line X—X' of FIG. 8.

FIG. 8 is a top plan view of an essential portion of a CCD solid-state imaging device adopting the above-described driving method, and FIG. 9 is a cross-sectional view taken along the line X—X' of FIG. 8. Here, an imaging portion of a frame transfer type CCD is shown.

A p-well area 22 is formed on one surface of an n-type semiconductor substrate 21, a plurality of p+-type channel stop areas 23 are arranged in the p-well area 22 in parallel with each other. An n-type diffusion area 24 is formed between adjacent ones of the channel stop areas 23, thus constituting an embedded-type storage and transfer channel area. Transfer electrodes 25a, 25b are formed on the diffusion area 24 via an insulating film 26 in a direction perpendicular to the channel stop area 23. These transfer electrodes 25a, 25b form a double-layered structure, and the upper-layer transfer electrode 25b has its width narrowed on the channel stop area 23 and is disposed by straddling adjacent ones of the lower-layer transfer electrodes 25a. These transfer electrodes 25a, 25b are driven by pulses by means of four-phase transfer clocks $\phi_{F1}$–$\phi_{F4}$, which are sequentially applied to the respective transfer electrodes 25a, 25b.

Figure 10:
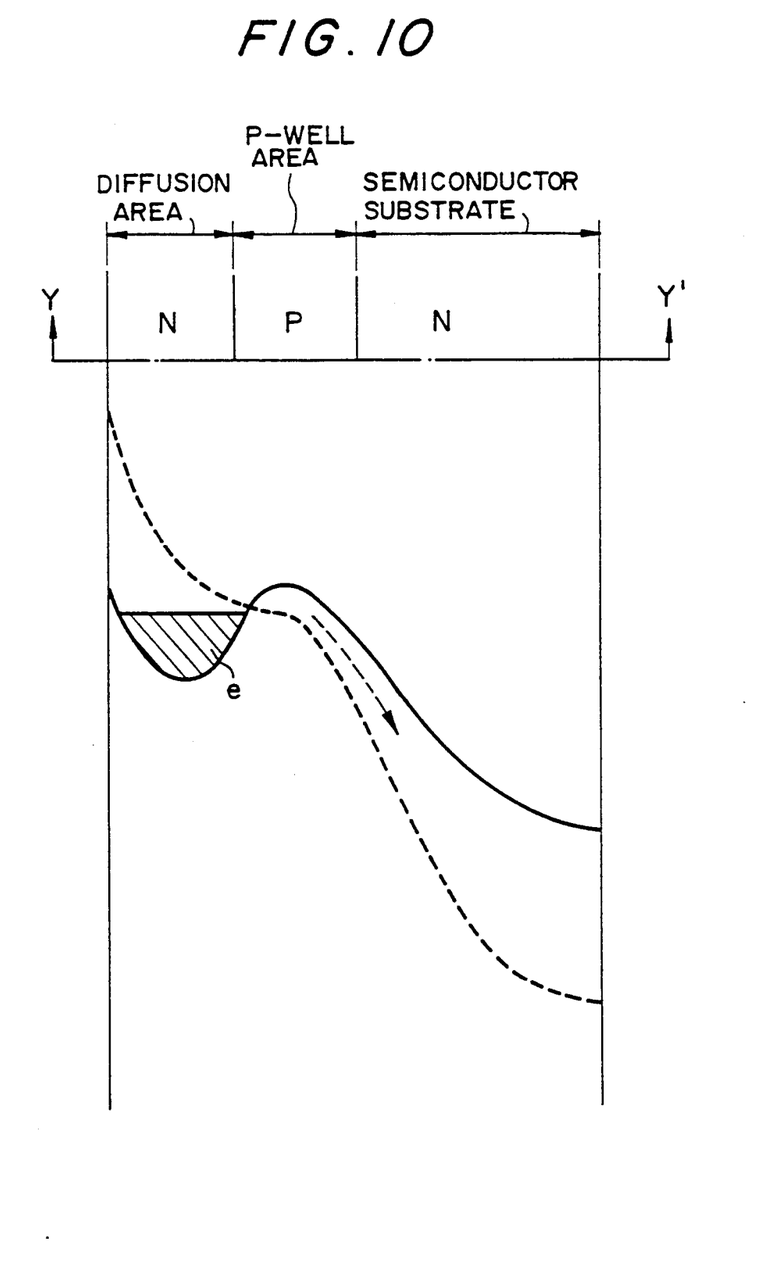
FIG. 10 is a diagram of potential in the CCD solid-state imaging device.

Meanwhile, a potential control clock $\phi$sub is applied to the semiconductor substrate 21, and the p-well area 22 is secured to the grounded potential via the channel stop area 23. FIG. 10 illustrates the state of potential at a line Y—Y' (in FIG. 9) at the time when the potential control clock $\phi$sub is thus applied to the semiconductor substrate 21 and a specific potential is applied to the p-well area. At this time, the transfer electrode 25b is held at a level higher by a fixed value with respect to the grounding level, and the semiconductor substrate 21 is held at a low potential, thereby forming a potential barrier in the vicinity of the p-well area 22. Accordingly, optical charge e is stored in a potential well formed between this potential barrier and the potential barrier on the surface of the semiconductor substrate 21. The transfer of this optical charge e is effected by varying the potential of each transfer electrode 25a, 25b within the range in which the potential barrier in the vicinity of the p-well area 22 is capable of maintaining a sufficient height.

Here, if the potential of the transfer electrodes 25a, 25b is set below a fixed level and the potential of the semiconductor substrate 21 is made high, the potential at the surface of the semiconductor substrate 21 becomes shallow, as shown by the broken line in FIG. 10, with the result that the potential inside the diffusion area 24 becomes shallow. Hence, the potential barrier in the vicinity of the p-well area 22 disappears, and the all the optical charge e flows to the semiconductor substrate 21 side. Accordingly, the discharge of the optical charge e stored in the storage and transfer channel can be effected by lowering the potential of the transfer electrodes 25a, 25b.

In accordance with such a method of discharging optical charge, it is possible to discharge the overall optical charge in the imaging portion substantially simultaneously and within a very short period of time, so that the smear is suppressed substantially in contrast to the method of discharging optical charge through reverse transfer.

However, when the optical charge is allowed to flow from the diffusion areas 24 to the semiconductor substrate 21 side, there are cases where unnecessary optical charge remains in the diffusion areas 24, in the same way as the above-described horizontal overflow drain structure. This is attributable to the concentration of impurities contained in such as the diffusion areas 24 and the p-well areas 22 as well as variations during manufacture in the thickness of these two types of areas 24, 22 and the like, which creates areas where the potential barrier in the vicinity of the p-well area 22 is liable to disappear and areas where it is difficult to disappear. If the potential at each area is made uniform, optical charge remains in areas where the potential barrier is difficult to disappear. To prevent the optical charge from remaining, a very high potential difference that will cause the potential barrier in the vicinity of the p-well area 22 to disappear sufficiently needs to be provided between the diffusion area 24 and the semiconductor substrate 21 for all the areas. Accordingly, there arises the problem that the voltage of the driving pulses for driving the CCD becomes disadvantageously high.

SUMMARY OF THE INVENTION

Accordingly, an object of the present invention is to provide a solid-state imaging device which makes it possible to lower the level of a drive pulse voltage at the time of discharging optical charge stored in a channel area and prevent the optical charge from remaining in the channel area at the time of discharge so as to read a signal having an appropriate exposure, thereby overcoming the above-described drawbacks of the conventional art.

To this end, in accordance with one aspect of the present invention, there is provided a solid-state imaging device having a horizontal-type overflow drain structure in which an overflow drain is formed at a channel stop area for dividing a channel area, wherein optical charge stored in the channel area is transferred in an opposite direction to a reading direction during a vertical scanning period and a potential barrier between the channel area and the overflow drain is extinguished during the period of transfer of the optical charge, thereby discharging the optical charge. After the discharge, the optical charge stored again in the channel area is transferred in the reading direction within a blanking period during the vertical scanning period.

In accordance with another aspect of the invention, there is provided a method of driving a solid-state imaging device having a vertical-type overflow drain structure in which a channel area is formed by being divided in a diffusion area formed on a semiconductor substrate, wherein optical charge stored in the channel area is transferred in an opposite direction to a reading direction during a vertical scanning period and a potential barrier between the channel area and the semiconductor substrate is extinguished during the period of transfer of the optical charge, thereby discharging the optical charge to the semiconductor substrate. After the discharge, the optical charge stored again in the channel area is transferred in the reading direction within a blanking period during the vertical scanning period.

Thus, with the method of driving a solid-state imaging device in accordance with the present invention, in the process in which optical charge stored in the channel area is transferred in an opposite direction of a reading direction, the optical charge is discharged to the overflow drain or the semiconductor substrate, so that the optical charge remaining in an area where a potential barrier between the channel area and the overflow drain or between the channel area and the semiconductor substrate is difficult to be extinguished can be discharged in an area where the potential barrier in a transfer path is easily extinguished. Hence, it is not necessary to extinguish the potential barrier between the channel area and the overflow drain or between the channel area and the semiconductor substrate over the entire areas. Accordingly, it becomes possible to discharge the optical charge substantially completely with a drive pulse voltage of a low level.

The above and other objects, features and advantages of the present invention will become more apparent from the following detailed description of the invention when read in conjunction with the accompanying drawings.

DESCRIPTION OF THE PREFERRED EMBODIMENTS

Figure 1:
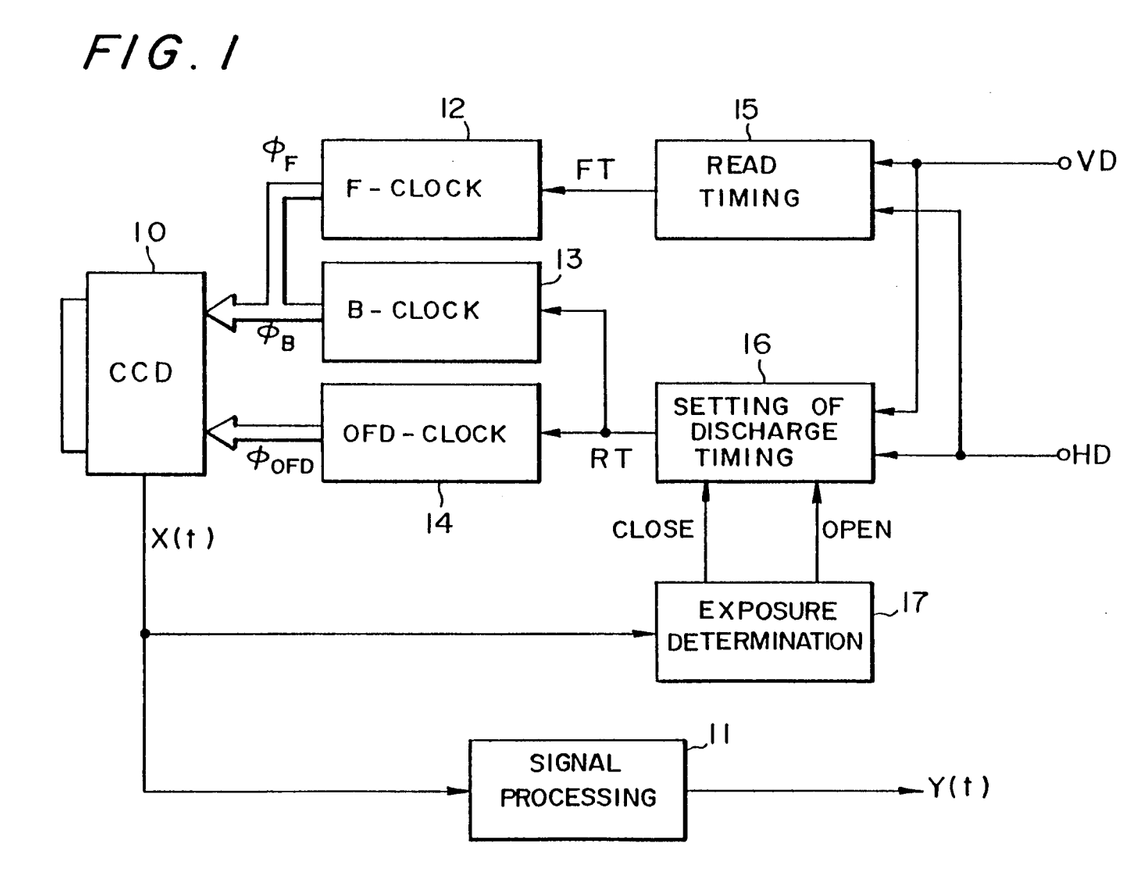
FIG. 1 is a block diagram of an imaging device in accordance with a first embodiment of a driving method of the present invention.

FIG. 1 is a block diagram of an imaging device of a first embodiment for effecting automatic exposure control using a method of driving a solid-state imaging device in accordance with the present invention.

A CCD solid-state imaging device 10 photoelectrically converts an image applied to an imaging portion, and outputs a video signal X(t) in which optical charge obtained is read and driven for each fixed period of time and is made continuous in the unit of a picture. The video signal X(t) is subjected to processing such as sample holding and gamma correction by means of a signal processing circuit 11, and is output to an external apparatus as a video signal Y(t).

The CCD 10 has a horizontal-type overflow drain structure shown in FIGS. 3 and 4, and is driven by pulses by means of various clocks. A forward transfer clock $\phi_F$ from a read clock generating circuit 12 and a reverse transfer clock $\phi_B$ from a discharge clock generating circuit 13 are respectively supplied to transfer electrodes, i.e., electrodes 5, 6 in FIG. 3, of an imaging portion. Furthermore, a potential control clock $\phi_{OFD}$ from a control clock generating circuit 14 is supplied to an overflow drain 3 of the CCD 10. Supplied to these clock generating circuits 12, 13, 14 are a read timing signal FT and a discharge timing signal RT respectively supplied from a read timing setting circuit 15 and a discharge timing setting circuit 16, and the clock generating circuits 12, 13, 14 thus operate in accordance with the read timing signal FT and the discharge timing signal RT.

That is, when the read timing signal FT is input to the read clock generating circuit 12, the forward transfer clock $\phi_F$ is supplied from the read clock generating circuit 12 to the transfer electrodes of the imaging portion, and optical charge stored in the channel area 4 of the CCD 10 is transferred in a reading direction by means of the forward transfer clock $\phi_F$. In addition, when the discharge timing signal RT is input to the discharge clock generating circuit 13, the reverse transfer clock $\phi_B$ is supplied from the discharge clock generating circuit 13 to the transfer electrodes of the imaging portion, and the potential control clock $\phi_{OFD}$ is supplied from the control clock generating circuit 14 to the overflow drain. As a result, the optical charge stored in the channel area 4 is transferred in an opposite direction to the reading direction and is discharged to the overflow drain by means of the electrode control clock $\phi_{OFD}$.

Here, the potential of the reverse transfer clock $\phi_B$ and the potential of the potential control clock $\phi_{OFD}$ are respectively set to low level and high level in comparison with the potential at the time of storing the optical charge, and are set to potential levels sufficient to extinguish a potential barrier between the channel area 4 and the overflow drain 3.

Meanwhile, an exposure determining circuit 17 detects an exposure of the video signal X(t) obtained from the CCD 10, and when that exposure is above a predetermined appropriate range, the exposure determining circuit 17 supplies an exposure suppressing signal CLOSE to a discharge timing setting circuit 16, while when it is less than the appropriate range, the exposure determining circuit 17 supplies an exposure accelerating signal OPEN to the discharge timing setting circuit 16. Upon receipt of the exposure suppressing signal CLOSE, the discharge timing setting circuit 16 delays an output timing of the discharge timing signal RT, while upon receipt of the exposure accelerating signal OPEN, the circuit 16 advances the output timing of the discharge timing signal RT, thereby adjusting the exposure time.

Figure 2:
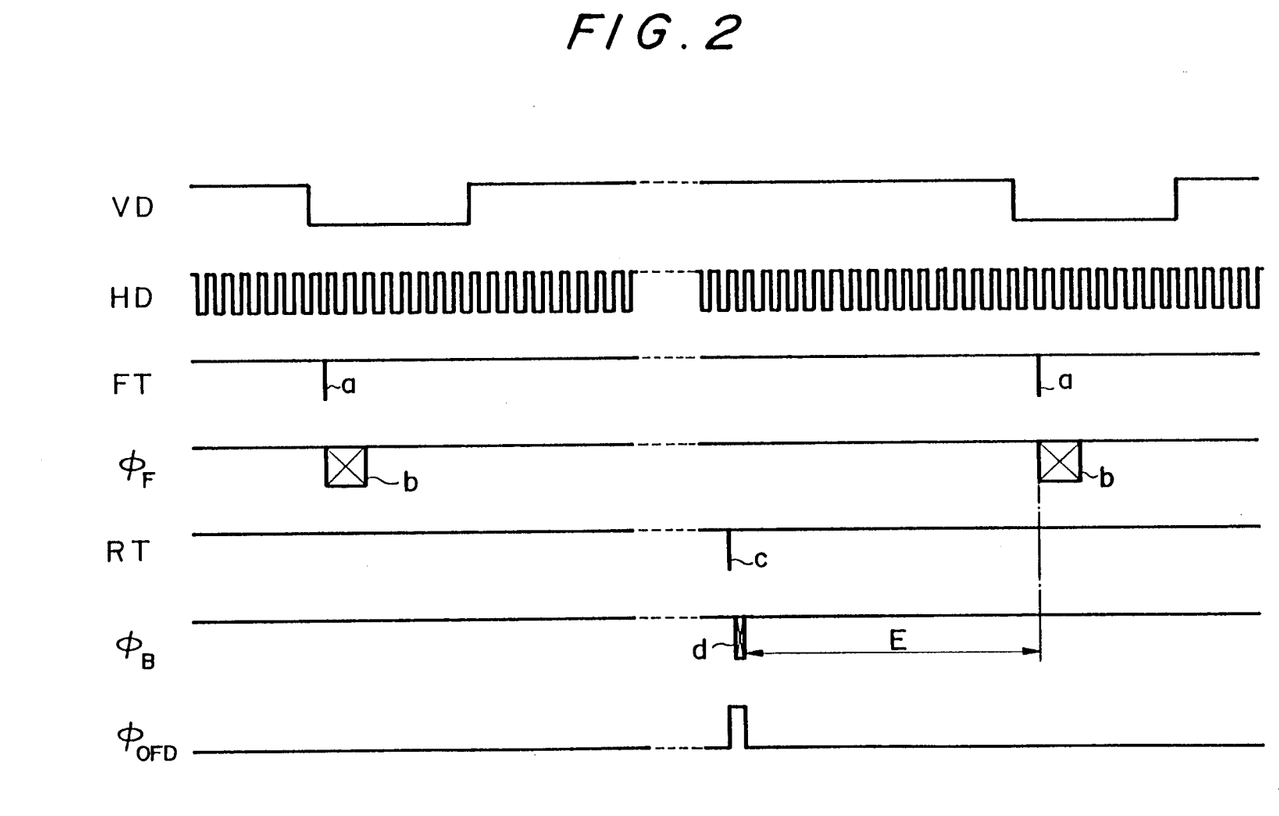
FIG. 2 is a timing chart of the operation shown in FIG. 1.

FIG. 2 is a timing chart illustrating the operation shown in FIG. 1.

The read timing signal FT has a timing pulse a at a predetermined timing during a blanking period of a vertical scanning signal VD, and the read clock generating circuit 12 generates a clock pulse b which transfers the optical charge of a one-picture portion in a vertical direction upon receipt of this timing pulse a. The discharge timing signal RT has a timing pulse c at a predetermined timing during the vertical scanning period, and the optical charge stored up till then is discharged at this timing. The arrangement provided is such that the timing at which this timing pulse c is produced is delayed by the exposure control signal CLOSE from the exposure determining circuit 17 and is advanced by the exposure accelerating signal OPEN. When the timing pulse c is input to the discharge clock generating circuit 13 and the control clock generating circuit 14, the potential control clock $\phi_{OFD}$ rises during a blanking period of a horizontal scanning signal HD, and falls similarly during a blanking period after a fixed period (here, one cycle of the horizontal scanning signal HD). The reverse transfer clock $\phi_B$ generates a clock pulse d during a blanking period of the horizontal scanning signal HD during the period of time after the potential control clock $\phi_{OFD}$ has risen until it falls. During the discharge of the optical charge, the potential of the overflow drain is increased by means of the potential control clock $\phi_{OFD}$, thereby forming a deep potential. Thus, the optical charge in the channel area is transferred in the opposite direction in a state in which the potential barrier between the channel area and the overflow drain is extinguished. Accordingly, if there is any area where the potential barrier fails to have been extinguished completely and the optical charge therefore remains, if that residual charge enters an area where the potential barrier has been extinguished while that residual charge is being transferred during a fixed section, that residual charge is discharged to the overflow drain. The period of time after completion of this discharge period until the forward transfer clock $\phi_F$ produces the clock pulse b is set as an exposure time E, and the optical charge of a one-picture portion is stored during this time E.

In accordance with the above described driving method, since it suffices if the optical charge is discharged from the channel area to the overflow drain at a portion of a fixed section where the optical charge is transferred by means of the reverse transfer clock $\phi_B$, even if there is any area where the optical charge is difficult to be discharged partially owing to variations in the manufacture of the CCD 10, it is possible to effect potential control in correspondence with this area and reduce the drive pulse voltage.

It should be noted that although in this embodiment a description has been given of a case in which the discharge timing of the optical charge is made to correspond to the exposure of the CCD 10 (automatic exposure control), a variable-speed electronic shutter can be realized by using the driving method of the present invention. In this case, a still picture of a predetermined shutter speed can be obtained by manually setting the discharge timing.

Thus, in accordance with the above-described first embodiment, since the optical charge remaining in the channel area can be discharged to the overflow drain without increasing the drive voltage, it is possible to discharge the optical discharge with high efficiency, so that it is readily possible to realize extension/shortening control of the exposure time.

In addition, since the drive voltage can be set to a low level, a circuit for generating the drive clock can be arranged with ease, so that a reduction in cost can be realized.

Figure 6:
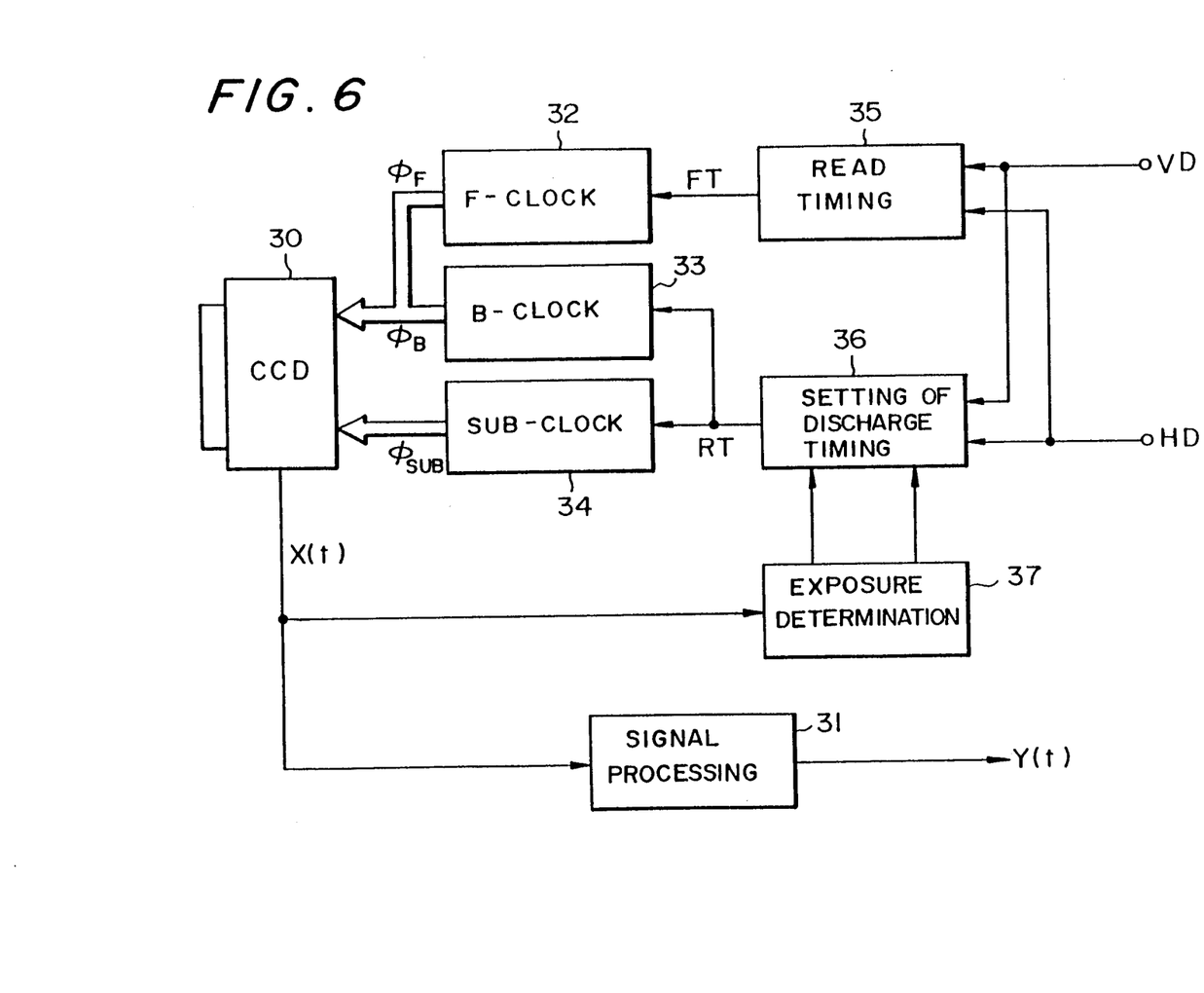
FIG. 6 is a block diagram of an imaging device in accordance with a second embodiment of the driving method of the present invention.

FIG. 6 is a block diagram of an imaging device of a second embodiment for effecting automatic exposure control by using a method of driving a solid-state imaging device in accordance with the present invention.

A CCD solid-state imaging device 30 photoelectrically converts an image applied to an imaging portion, and outputs a video signal X(t) in which optical charge obtained is read and driven for each fixed period of time and is made continuous in the unit of a picture. The video signal X(t) is subjected to processing such as sample holding and gamma correction by means of a signal processing circuit 11, and is output to an external apparatus as a video signal Y(t).

The CCD 30 has a vertical type overflow drain structure shown in FIGS. 8 and 9, and is driven by pulses by means of various clocks. A forward transfer clock $\phi_F$ from a read clock generating circuit 32 and a reverse transfer clock $\phi_B$ from a discharge clock generating circuit 33 are respectively supplied to transfer electrodes of an imaging portion. Furthermore, a potential control clock $\phi$sub from a control clock generating circuit 34 is supplied to an overflow drain 3 of the CCD 30. Supplied to these clock generating circuits 32, 33, 34 are a read timing signal FT and a discharge timing signal RT respectively supplied from a read timing setting circuit 35 and a discharge timing setting circuit 36, and the clock generating circuits 32, 33, 34 thus operate in accordance with the read timing signal FT and the discharge timing signal RT.

That is, when the read timing signal FT is input to the read clock generating circuit 32, the forward transfer clock $\phi_F$ is supplied from the read clock generating circuit 32 to the transfer electrodes of the imaging portion, and optical charge stored in a channel area 24 of the CCD 30 is transferred in the reading direction by means of the forward transfer clock $\phi_F$. In addition, when the discharge timing signal RT is input to the discharge clock generating circuit 33, the reverse transfer clock $\phi_B$ is supplied from the discharge clock generating circuit 33 to the transfer electrodes of the imaging portion, and the potential control clock $\phi$sub is supplied from the control clock generating circuit 34 to the semiconductor substrate. As a result, the optical charge stored in the channel area 24 is transferred in an opposite direction to the reading direction and is discharged to the semiconductor substrate by means of the electrode control clock $\phi$sub.

Here, the potential of the reverse transfer clock $\phi_B$ and the potential of the potential control clock $\phi$sub are respectively set to low level and high level in comparison with the potential at the time of storing the optical charge, and are set to potential levels sufficient to extinguish a potential barrier between the channel area 24 and the semiconductor substrate 23.

Meanwhile, an exposure determining circuit 37 detects an exposure of the video signal X(t) obtained from the CCD 30, and when that exposure is above a predetermined appropriate range, the exposure determining circuit 37 supplies an exposure suppressing signal CLOSE to a discharge timing setting circuit 36, while when it is less than the appropriate range, the exposure determining circuit 37 supplies an exposure accelerating signal OPEN to the discharge timing setting circuit 36. Upon receipt of the exposure suppressing signal CLOSE, the discharge timing setting circuit 36 delays an output timing of the discharge timing signal RT, while upon receipt of the exposure accelerating signal OPEN, the circuit 36 advances the output timing of the discharge timing signal RT, thereby adjusting the exposure time.

Figure 7:
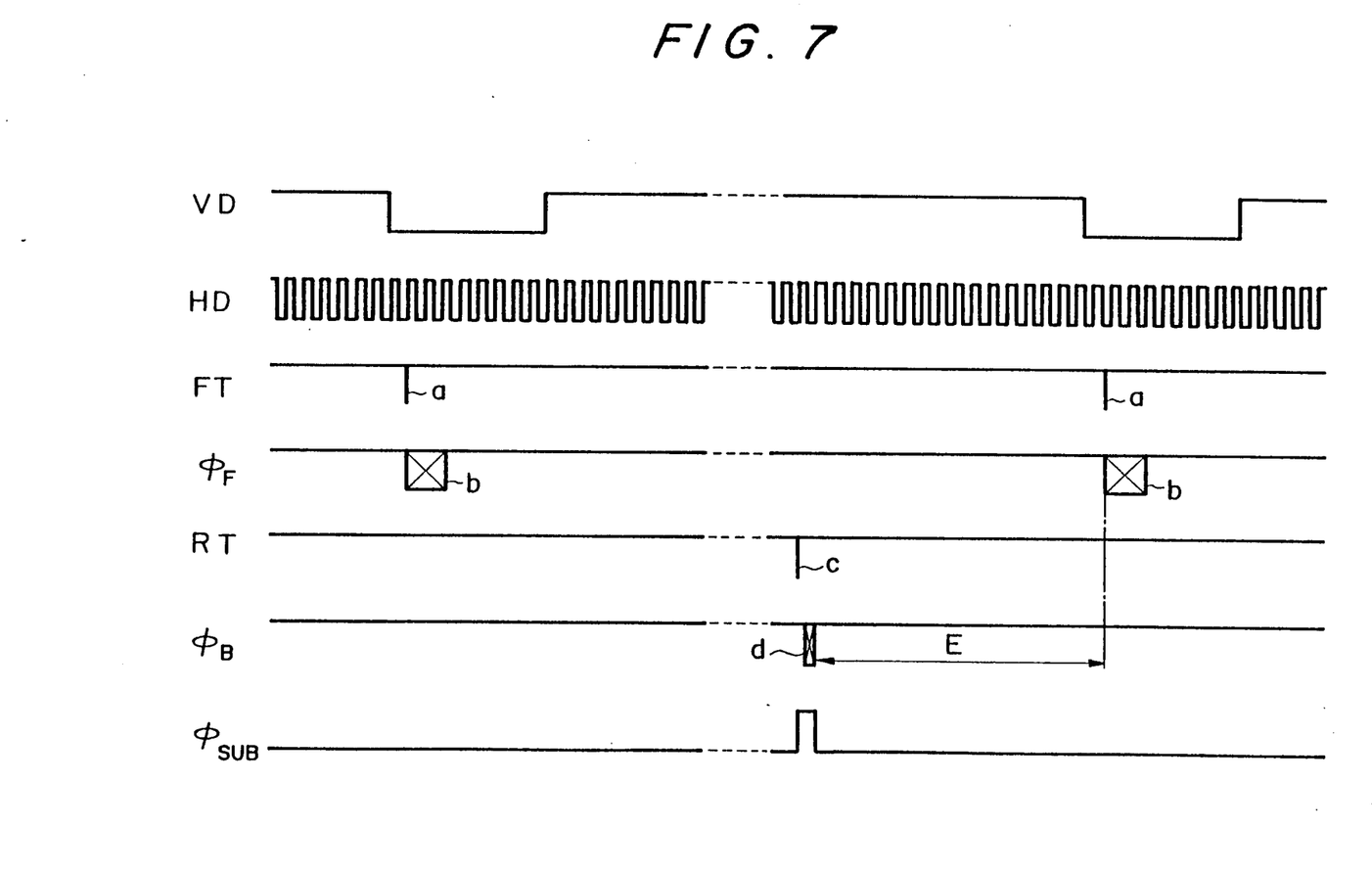
FIG. 7 is a timing chart of the operation shown in FIG. 6.

FIG. 7 is a timing chart illustrating the operation shown in FIG. 6.

The read timing signal FT has a timing pulse a at a predetermined timing during a blanking period of a vertical scanning signal VD, and the read clock generating circuit 32 generates a clock pulse b which transfers the optical charge of a one-picture portion in a vertical direction upon receipt of this timing pulse a. The discharge timing signal RT has a timing pulse c at a predetermined timing during the vertical scanning period, and the optical charge stored up till then is discharged at this timing. The arrangement provided is such that the timing at which this timing pulse c is produced is delayed by the exposure control signal CLOSE from the exposure determining circuit 37 and is advanced by the exposure accelerating signal OPEN.

When the timing pulse c is input to the discharge clock generating circuit 33 and the control clock generating circuit 34, the potential control clock $\phi$sub rises during a blanking period of a horizontal scanning signal HD, and falls similarly during a blanking period after a fixed period (here, one cycle of the horizontal scanning signal HD). The reverse transfer clock $\phi_B$ generates a clock pulse d during a blanking period of the horizontal scanning signal HD during the period of time after the potential control clock $\phi$sub has risen until it falls. During the discharge of the optical charge, the potential of the semiconductor substrate is increased by means of the potential control clock $\phi$sub, thereby forming a deep potential. Thus, the optical charge in the channel area is transferred in the opposite direction in a state in which the potential barrier between the channel area and the semiconductor substrate is extinguished. Accordingly, if there is any area where the potential barrier fails to have been extinguished completely and the optical charge therefore remains, if that residual charge enters an area where the potential barrier has been extinguished while that residual charge is being transferred during a fixed section, that residual charge is discharged to the semiconductor substrate. The period of time after completion of this discharge period until the forward transfer clock $\phi_F$ produces the clock pulse b is set as an exposure time E, and the optical charge of a one-picture portion is stored during this time E.

In accordance with the above-described driving method, since it suffices if the optical charge is discharged from the channel area to the semiconductor substrate at a portion of a fixed section where the optical charge is transferred by means of the reverse transfer clock $\phi_B$, even if there is any area where the optical charge is difficult to be discharged partially owing to variations in the manufacture of the CCD 30, it is possible to effect potential control in correspondence with this area and reduce the drive pulse voltage.

It should be noted that although in this embodiment a description has been given of a case in which the discharge timing of the optical charge is made to correspond to the exposure of the CCD 30 (automatic exposure control), a variable-speed electronic shutter can be realized by using the driving method of the present invention. In this case, a still picture of a predetermined shutter speed can be obtained by manually setting the discharge timing.

Thus, in accordance with the above-described second embodiment, since the optical charge remaining in the channel area can be discharged to the semiconductor substrate without increasing the drive voltage, it is possible to discharge the optical discharge with high efficiency, so that it is readily possible to realize extension/shortening control of the exposure time.

In addition, since the drive voltage can be set to a low level, a circuit for generating the drive clock can be arranged with ease, so that a reduction in cost can be realized.

What is claimed is:

1. A method of driving a solid-state imaging device having a horizontal-type overflow drain structure including an overflow drain formed along a channel area through which electric charges are transferred, the method comprising the steps of:

discharging, from said channel area to said overflow drain area, optical charges stored in said channel area by having extinguished a potential barrier present between said channel area and said overflow drain area, and transferring said optical charge which is stored in said channel area in a direction opposite to a reading direction during said discharging period; and transferring the optical charge stored in said channel area in the reading direction after said discharging step.

2. A method according to claim 1, wherein the storage of the optical charge is effected by forming the potential barrier between said channel area and said overflow drain by applying predetermined voltages to said channel area and said overflow drain, respectively.

3. A method according to claim 1, wherein the optical charge is transferred in the reading direction and an opposite direction thereto by means of a pulse voltage applied sequentially to said channel area.

4. A method of driving a solid-state imaging device having a horizontal-type overflow drain structure, comprising:

a discharging step of transferring optical charge stored in a channel area in an opposite direction to a reading direction and causing a potential barrier between said channel area and an overflow drain to be extinguished during a period of the transfer of the optical charge, wherein the extinction of said potential barrier between said channel area and said overflow drain is effected by setting a voltage applied to said channel area to a level lower than at the time of storage of the optical charge and by setting a voltage applied to said overflow drain to a level higher than at the time of the storage of the optical charge; and a scanning step of transferring the optical charge stored in said channel area in the reading direction after said discharging step.

5. A method according to claim 1, wherein said discharging step is executed at a designated timing within a vertical scanning period of said solid-state imaging device, while said scanning step is executed at a predetermined timing within a blanking period during the vertical scanning period.

6. A method of driving a solid-state imaging device having a horizontal-type overflow drain structure, comprising:

a discharging step of transferring optical charge stored in channel area in an opposite direction to a reading direction and causing a potential barrier between said channel area and an overflow drain to be extinguished during a period of the transfer of the optical charge, wherein said discharging step is executed at a designated timing within a vertical scanning period of said solid state imaging device, while said scanning step is executed at a predetermined timing within a blanking period during the vertical scanning period, and wherein said designated timing is designated in correspondence with a predetermined appropriate exposure range of said solid-state imaging device; and a scanning step of transferring the optical charge stored in said channel area in the reading direction after said discharging step.

7. A method according to claim 6, wherein when an exposure of a video signal read from said solid-state imaging device in said scanning step is more than said predetermined appropriate exposure range, said designated timing is delayed, while when it is less than said appropriate exposure range, said designated timing is advanced.

8. A method of driving a solid-state imaging device having a vertical-type overflow drain including a semiconductor area which is formed on a deep portion of a substrate of the same conducting type as a channel area through which optical charge is transferred, the method comprising the steps of:

discharging, from said channel area to said semiconductor area, optical charges stored in said channel area by having extinguished a potential barrier present between said channel area and the semiconductor area, and transferring said optical charge which is stored in said channel area in a direction opposite to a reading direction during said discharging period; and transferring the optical charge stored in said channel area in the reading direction after said discharging step.

9. A method according to claim 8, wherein the storage of the optical charge is effected by forming the potential barrier between said channel area and said semiconductor substrate by applying predetermined voltages to said channel area and said semiconductor substrate, respectively.

10. A method according to claim 8, wherein the optical charge is transferred in the reading direction and an opposite direction thereto by means of a pulse voltage applied sequentially to said channel area.

11. A method of driving a solid-state imaging device having a vertical-type overflow drain structure, comprising:

a discharging step of transferring optical charge stored in a channel area in an opposite direction to a reading direction and causing a potential barrier between said channel area and a semiconductor substrate to be extinguished during a period of the transfer of the optical charge, wherein the extinction of said potential barrier between said channel area and said semiconductor substrate is effected by setting a voltage applied to said channel area to a level lower than at the time of storage of the optical charge and by setting a voltage applied to said semiconductor substrate to a level higher than at the time of the storage of the optical charge; and a scanning step of transferring the optical charge stored in said channel area in the reading direction after said discharging step.

12. A method according to claim 8, wherein said discharging step is executed at a designated timing within a vertical scanning period of said solid-state imaging device, while said scanning step is executed at a predetermined timing within a blanking period during the vertical scanning period.

13. A method of driving a solid-state imaging device having a vertical-type overflow drain structure, comprising:

a discharging step of transferring optical charge stored in a channel area in an opposite direction to a reading direction and causing a potential barrier between said channel area and a semiconductor substrate to be extinguished during a period of the transfer of the optical charge, wherein said discharging step is executed at a designated timing within a vertical scanning period of said solid-state imaging device, while said scanning step is executed at a predetermined timing within a blanking period during the vertical scanning period, and wherein said designated timing is designated in correspondence with a predetermined appropriate exposure range of said solid-state imaging device; and a scanning step of transferring the optical charge stored in said channel area in the reading direction after said discharging step.

14. A method according to claim 13, wherein when an exposure of a video signal read from said solid-state imaging device in said scanning step is more than said predetermined appropriate exposure range, said designating timing is delayed, while when it is less than said appropriate exposure range, said designated timing is advanced.

* * * * *